United States Patent
Kwong (10) Patent No.: US 9,623,628 B2
(45) Date of Patent: Apr. 18, 2017

(54) SAPPHIRE COMPONENT WITH RESIDUAL COMPRESSIVE STRESS

(71) Applicant: Apple Inc., Cupertino, CA (US)

(72) Inventor: Kelvin Kwong, San Jose, CA (US)

(73) Assignee: APPLE INC., Cupertino, CA (US)

( * ) Notice: Subject to any disclaimer, the term of this patent is extended or adjusted under 35 U.S.C. 154(b) by 24 days.

(21) Appl. No.: 13/738,200

(22) Filed: Jan. 10, 2013

(65) Prior Publication Data

US 2014/0193606 A1 Jul. 10, 2014

(51) Int. Cl.

| B32B 3/26 | (2006.01) |
|---|---|
| B32B 7/02 | (2006.01) |
| C04B 41/00 | (2006.01) |
| C30B 29/20 | (2006.01) |
| C30B 33/02 | (2006.01) |
| H04M 1/02 | (2006.01) |
| H04M 1/18 | (2006.01) |

(52) U.S. Cl.
CPC .......... *B32B 7/02* (2013.01); *B32B 3/266* (2013.01); *C04B 41/0036* (2013.01); *C04B 41/0081* (2013.01); *C30B 29/20* (2013.01); *C30B 33/02* (2013.01); *H04M 1/0266* (2013.01); *H04M 1/185* (2013.01); *Y10T 29/49826* (2015.01); *Y10T 428/24331* (2015.01); *Y10T 428/24992* (2015.01)

(58) Field of Classification Search
CPC ......... C30B 29/20; C30B 33/02; B32B 3/266; B32B 7/02; C04B 41/0036; C04B 41/0081; H04M 1/0266; H04M 1/185; Y10T 29/49826; Y10T 428/24331; Y10T 428/24992

USPC .............................................. 117/3
See application file for complete search history.

(56) References Cited

U.S. PATENT DOCUMENTS

| 4,088,799 A | 5/1978 | Kurtin |
| 4,200,506 A | 4/1980 | Dreschhoff et al. |
| 4,282,290 A | 8/1981 | Pellicori |
| 4,316,385 A | 2/1982 | DeVries et al. |

(Continued)

FOREIGN PATENT DOCUMENTS

| EP | 1585166 | 10/2005 |
| EP | 2388980 | 11/2011 |

(Continued)

OTHER PUBLICATIONS

Burnett, P.J. et al., "An investigation of ion implantation-induced near-surface stresses and their effects in sapphire and glass," Journal of Materials Science 20, Dec. 1985, vol. 20, Issue 12, 23 pages.

(Continued)

*Primary Examiner* — Michael Kornakov
*Assistant Examiner* — Hua Qi
(74) *Attorney, Agent, or Firm* — Brownstein Hyatt Farber Schreck, LLP (57) ABSTRACT

A method comprises shaping an aluminum oxide ceramic material into a component for an electronic device. The component has first and second major surfaces. A selected region of one or both of the first and second major surfaces is heated to an annealing temperature. The selected region is then cooled below the annealing temperature, so that residual compressive stress is generated in the selected region.

27 Claims, 7 Drawing Sheets

(56) References Cited

U.S. PATENT DOCUMENTS

| | | | |
|---|---|---|---|
| 4,732,867 | A | 3/1988 | Schnable |
| 5,262,392 | A | 11/1993 | Hung et al. |
| 5,697,998 | A * | 12/1997 | Platus .................... C03B 29/00 65/104 |
| 5,702,654 | A | 12/1997 | Chen et al. |
| 5,709,471 | A * | 1/1998 | Platus ...................... G01N 3/60 374/57 |
| 6,222,194 | B1 | 4/2001 | Regan |
| 6,982,181 | B2 | 1/2006 | Hideo |
| 7,456,080 | B2 | 11/2008 | Gadkaree |
| 7,726,532 | B2 * | 6/2010 | Gonoe ............... B23K 26/0736 225/1 |
| 7,902,527 | B2 | 3/2011 | Chen et al. |
| 8,309,431 | B2 | 11/2012 | Nguyen et al. |
| 8,313,989 | B2 | 11/2012 | Ohnuma et al. |
| 8,396,582 | B2 | 3/2013 | Kaushal et al. |
| 2002/0051848 | A1 * | 5/2002 | Li .............................. 427/376.6 |
| 2002/0102761 | A1 * | 8/2002 | Hasegawa et al. ............. 438/46 |
| 2003/0166311 | A1 * | 9/2003 | Miyazawa ...................... 438/82 |
| 2005/0133798 | A1 * | 6/2005 | Jung ........................ C30B 25/02 257/79 |
| 2005/0170872 | A1 * | 8/2005 | Vuori ................ H04M 1/72575 455/575.8 |
| 2006/0019035 | A1 | 1/2006 | Munz et al. |
| 2006/0060796 | A1 | 3/2006 | Subramanian |
| 2007/0075192 | A1 * | 4/2007 | Mian et al. ................... 246/1 R |
| 2007/0137740 | A1 * | 6/2007 | Johnson ................ A61L 31/022 148/562 |
| 2007/0172661 | A1 | 7/2007 | Fechner et al. |
| 2008/0011738 | A1 * | 1/2008 | Yoshie ....................... 219/460.1 |
| 2009/0081424 | A1 | 3/2009 | Gomi |
| 2010/0103140 | A1 | 4/2010 | Hansson |
| 2011/0019123 | A1 | 1/2011 | Prest et al. |
| 2011/0171429 | A1 | 7/2011 | Huang et al. |
| 2011/0200760 | A1 | 8/2011 | Park et al. |
| 2011/0204532 | A1 | 8/2011 | Kinoshita et al. |
| 2011/0287812 | A1 * | 11/2011 | Joo ....................... H04M 1/185 455/566 |
| 2011/0312115 | A1 * | 12/2011 | Kato .................. B23K 26/0057 438/33 |
| 2012/0015799 | A1 | 1/2012 | Shonai |
| 2012/0135177 | A1 * | 5/2012 | Cornejo .................. B26F 3/002 428/43 |
| 2012/0236526 | A1 | 9/2012 | Weber |

FOREIGN PATENT DOCUMENTS

| | | |
|---|---|---|
| JP | 5795899 | 6/1982 |
| KR | 20040023447 | 3/2004 |
| KR | 20110034889 | 4/2011 |
| KR | 20110039962 | 4/2011 |
| WO | WO2008/122296 | 10/2008 |
| WO | WO2009/128315 | 10/2009 |
| WO | WO2009/151160 | 12/2009 |

OTHER PUBLICATIONS

Demaree JD et al., "Modification of single-crystal sapphire by ion implantation," Nuclear Instruments & Methods in Physics Research, Section—B:Beam Interactions with Materials and Atoms, Elsevier, Amsterdam, NL, vol. 127-128, May 2, 1997, pp. 603-607.

Kirkpatrick A et al., "Effect of Ion Implantation on the Strength of Sapphire at 300-600° C.," Journal of Materials Science, Kluwer Academic Publishers, Dordrecht, vol. 36, No. 9, May 1, 2001, pp. 2195-2201.

Kobrin, P.H. et al., "Compressive thin films for increased fracture toughness," Proceedings of SPIE, vol. 683, Jan. 1, 1986-Aug. 19, 1986, 5 pages.

Liu, C.M. et al., "The effect of annealing, precipitation-strengthening, and compressive coating processes on sapphire strength," Materials Science and Engineering A: Structural Materials: Properties, Microstructure & Processing, Lausanne, Switzerland, vol. 420, No. 1-2, Mar. 25, 2006, 8 pages.

Saito et al., "Coloration of Sapphire by Metal-Ion Implantation," 362 Japanese Journal of Applied Physics, Nov. 24, 1985, No. 11, Part II, Tokyo, Japan.

International Search Report and Written Opinion, PCT Application No. PCT/EP2013/078173, 12 pages, May 2, 2014.

Partial European Search Report, EP Application No. 14155530, 8 pages, Jul. 2, 2014.

European Search Report, EP Application No. 14155530, 13 pages, Nov. 6, 2014.

Extended European Search Report, EP Application No. 14150283.1, 5 pages, May 2, 2014.

Extended European Search Report, EP Application No. 14150764, 6 pages, May 2, 2014.

U.S. Appl. No. 13/783,264, filed Mar. 2, 2013, Dale N. Memering.

U.S. Appl. No. 13/736,676, filed Jan. 8, 2013, Kelvin Kwong.

* cited by examiner

SAPPHIRE COMPONENT WITH RESIDUAL COMPRESSIVE STRESS

TECHNICAL FIELD

This subject matter of this disclosure relates generally to display and cover glass components for electronic devices, including, but not limited to, mobile phones and other personal digital devices. In particular, the disclosure relates to display and cover glass components suitable for use in smartphones, mobile and cellular devices, tablet computers, personal computers, personal digital assistants, media players, and other electronic devices, in both portable and stationary applications.

BACKGROUND

Electronic devices generally include a variety of different display and cover components, including front and back glasses (or cover glasses), display windows, touch screens, track pads, camera lenses and covers, and other internal and external components for which optical properties, strength and durability are design issues. In use, these components are subject to a wide range of environmental and operational effects, including shock, impact, scratching, and temperature and pressure extremes.

These effects raise a number of design and engineering considerations, particularly for cover glass and display components in which performance and operational range are limited by environmental factors. These considerations include stress and strain resistance, machinability, temperature stability, and other properties such as electrical resistance, thermal conductivity, and magnetic permeability. As a result, there is a need for improved cover glass and display components that address these considerations without suffering the limitations of the prior art, while providing impact and shock resistance across a broad range of environmental and operational conditions.

SUMMARY

This disclosure relates to cover glasses, displays, and other components for electronic devices, methods of making the components, and electronic devices incorporating the components. In various examples and embodiments, an aluminum oxide ceramic or sapphire material is shaped into a component for assembly into an electronic device. A selected region of the component is heated to an annealing temperature, then cooled below the annealing temperature to generate residual compressive stress in the selected region, for example along one or both major surfaces.

The sapphire component may be formed with a substantially single crystal plane orientation, extending between the first and second major surfaces. The selected region may be prone to impact when the sapphire component is assembled into the electronic device, for example an edge or corner portion of a cover glass component. The selected region may also exclude a central portion of the cover glass, for example a central portion that is less prone to impact, as compared to the edge or corner portion.

The selected region of the sapphire component may also include at least a portion of each of the first and second major surfaces, or the selected region may exclude one of the first and second major surfaces. A failure pattern may also be defined, based on the residual compressive stress generated in the selected region of the sapphire or ceramic component.

Heating the selected region of the component may be performed by laser heating of one or both of the major surfaces, and cooling may be performed by directing a jet of cooling fluid onto the major surface(s), in the selected region. The substantially single crystal plane orientation of the sapphire component can be maintained between the first and second major surfaces, throughout the heating and cooling steps.

In additional examples and embodiments, a cover glass component for an electronic device may include a substantially single crystal aluminum oxide material defined between first and second major surfaces. Residual compressive stress may be induced in a first portion of the cover glass component, so that the component has greater residual compressive stress in the first portion, in which the residual stress is induced, as compared to other portions, in which the residual compressive stress is not induced.

When assembled into an electronic device, the first portion of the cover glass component may be more prone to impact than the second portion. For example, the first portion may include a corner region of the cover glass component, and the second portion may include a center region. The first portion may also be adjacent an edge of the cover glass component, and the second portion may be spaced from the edge by the first portion.

In further examples and embodiments, a mobile device may include a display in combination with the cover glass component. Alternatively, a mobile electronic device may include an aluminum oxide ceramic or sapphire cover glass component with a first major surface adjacent a display and a second major surface opposite the display; that is, with the first and second major surfaces oriented toward the interior and exterior of the device, respectively. Residual compressive stress may be induced in a selected region of the cover glass component, so that the selected region has greater residual compressive stress than other regions, in which the residual compressive stress is not induced.

The selected region of the cover glass component may include a corner region of one or both of the first and second major surfaces, and the other region may include a central portion, in which the residual compressive stress is not induced. The selected region may also be more prone to impact when the mobile electronic device is dropped, as compared to any region in which the residual compressive stress is not induced.

DETAILED DESCRIPTION

Figure 1:
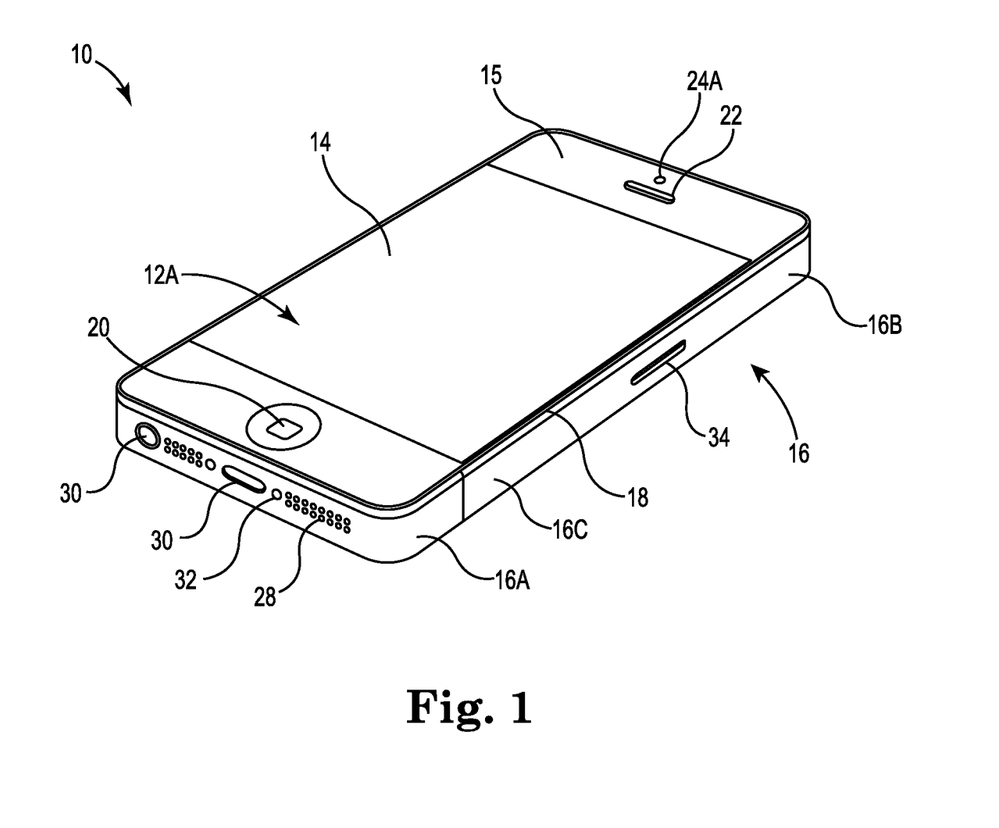
FIG. 1 is a perspective view of an electronic device in a communications embodiment, showing the front cover glass.
Figure 2A:
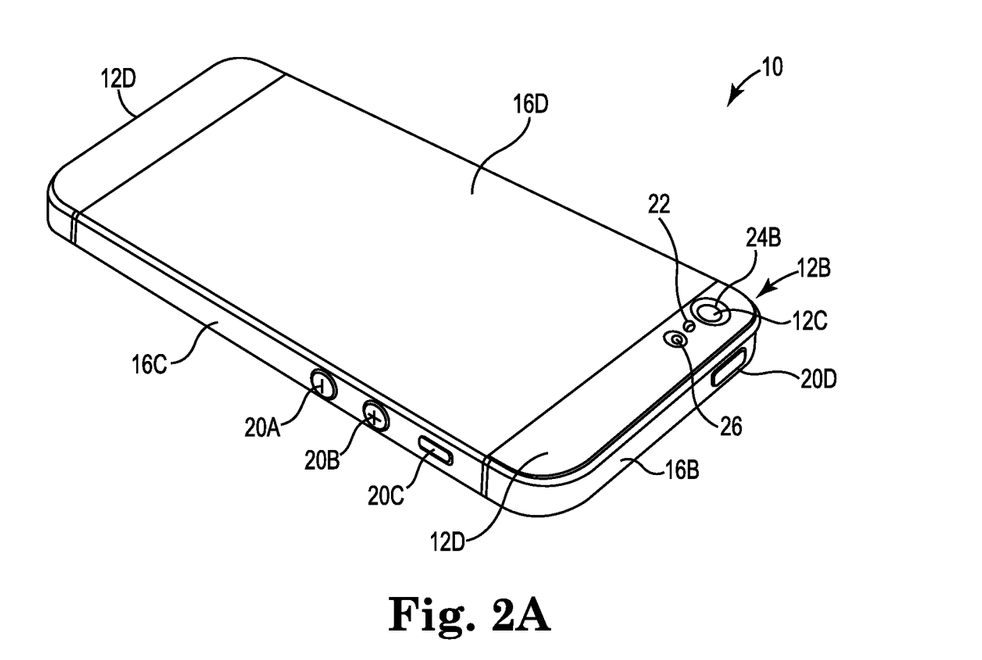
FIG. 2A is a rear perspective view of the device, showing the back cover glass.
Figure 2B:
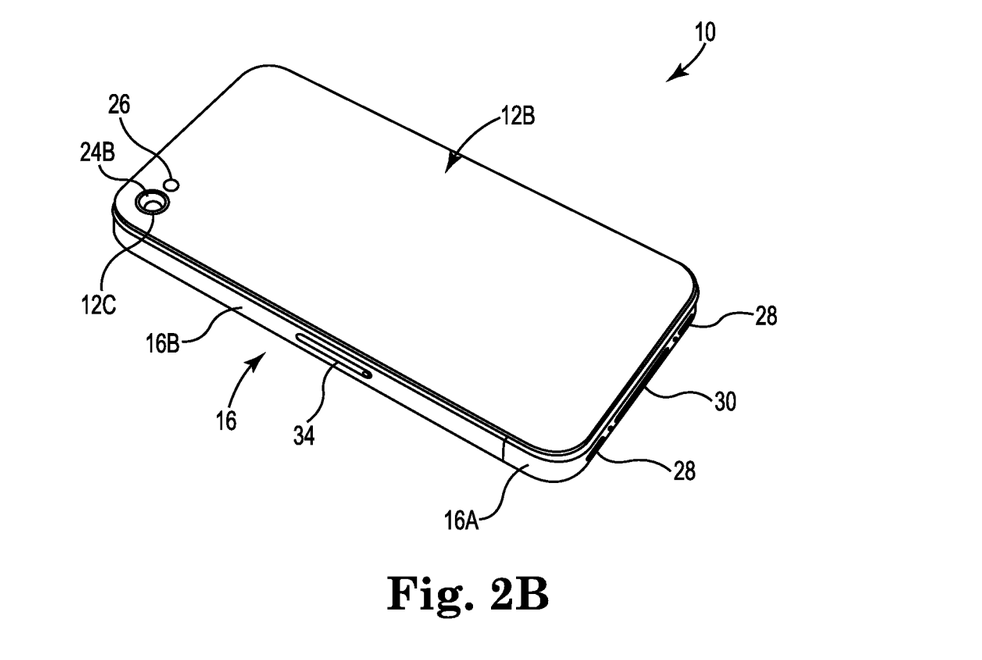
FIG. 2B is an alternate view of the electronic device, with the back cover glass in a different configuration.

FIG. 1 is a perspective view of electronic device 10, in a communications embodiment. As shown in FIG. 1, device 10 includes front cover or cover glass 12A with display window 14 and housing assembly 16, as configured, for example, in a mobile phone or smartphone application. Alternatively, device 10 may be configured as a media player, digital assistant, tablet computer, personal computer, computer display, or other electronic device, in either portable or stationary form. FIGS. 2A and 2B are rear perspective views of device 10, showing alternate configurations for back glass 12B and housing 16.

In the particular example of FIG. 1, front cover glass 12A and rear cover glass 12B are coupled to top and bottom housing components 16A and 16B of housing assembly 16 via a bezel or frame assembly 18. One or both of front and rear cover glass components 12A and 12B may also incorporate an aluminum oxide, sapphire crystal, or sapphire glass material, with residual compressive stress to provide impact resistance, durability, and improved stress and strain performance, as described below.

Display window 14 is typically configured for viewing a touch screen or other display component through cover glass 12A, for example as defined between border regions 15. Depending on configuration, display window 14 may also accommodate interactive control features, for example internal or external touch screen or touch-sensitive display components, with capacitive or resistive coupling across the front surface of cover glass 12A.

Cover glasses 12A and 12B may also include apertures to accommodate additional control and accessory features, including, but not limited to, a home button or other control device 20, and one or more audio (e.g., speaker or microphone) features 22, sensors or cameras 24A and 24B, and lighting or indicator features 26 (e.g., a flash unit or light emitting diode). Depending on design, additional glass or sapphire based components may also be provided for control and accessory features 20, 22, 24A, 24B and 26, for example a separate cover glass element 12C for camera 24B, as provided in back cover glass 12B.

Housing 16 and frame 18 are typically formed of metal, composites, and durable polymer materials, including metals and metal alloys such as aluminum and stainless steel, durable plastics, and carbon-based or fiber/matrix composites. Housing 16 and frame 18 may either be provided in substantially unitary form or as discrete components, for example with one or more top, bottom, side and back housing sections 16A, 16B, 16C, and 16D in combination with a unitary or multi-part bezel or frame assembly 18.

Cover glasses 12A and 12B, housing 16 and frame 18 can also be configured to accommodate additional accessory features, including, but not limited to, speaker or microphone apertures 28, connector apertures 30 for power, audio, and data communications, mechanical fasteners 32, and access ports 34, e.g., for a subscriber identity module or SIM card, a flash memory device, or other internal component of electronic device 10.

FIG. 2A is a rear perspective view of electronic device 10, showing back glass 12B in the form or two or more discrete inlay or inset components 12D. Housing 16 is also provided in a multi-part configuration, for example with bottom housing 16A, top housing 16B, and side housing sections 16C.

Depending on configuration, side housings 16C may be coupled across middle plate 16D to form the back surface of device 10, between back glass insets 12D, as shown in FIG. 2A, and housing components 16A, 16B, and 16C may be provided in either beveled or unbeveled form. A separate cover glass element 12C may also be provided for back camera 24B, as described above.

FIG. 2B is a perspective view of electronic device 10, showing back glass 12B in a unitary configuration, with two-part housing assembly 16A (bottom) and 16B (top). As shown in FIGS. 2A and 2B, unitary and multi-piece back glass components 12B and 12D may be variously configured to accommodate a range of different accessories, including microphones and other audio features 22, back camera or other sensor features 24B, and a flash unit or other lighting/indicator feature 26. Device 10 may also accommodate additional control features, for example volume buttons 20A and 20B, ringer/mute switch 20C, and hold button 20D, as provided in any combination of cover glass components 12A-12D and housing components 16A-16D.

Figure 3:
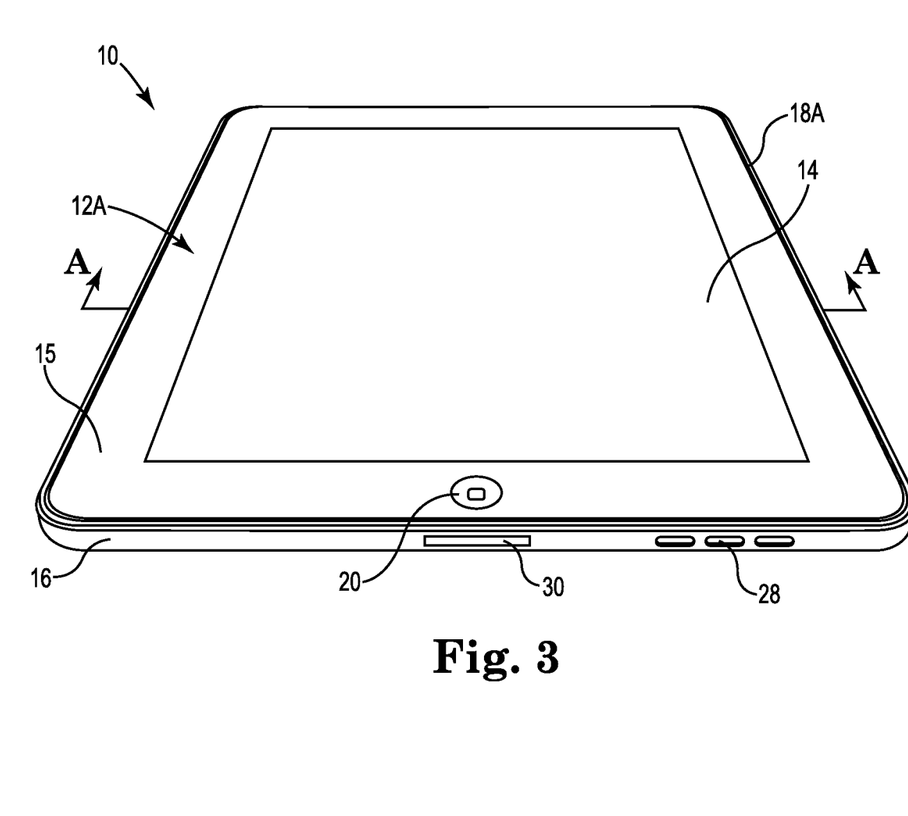
FIG. 3 is a front perspective view of the electronic device, in a media player or tablet computer embodiment.

FIG. 3 is a front perspective view of electronic device 10 in an alternate embodiment, for example a media player, tablet computer, pad computer, or other computing device, or a computer monitor or display. As shown in FIG. 3, front glass 12A is configured to accommodate display window 14 and accessory features including a hold button or other control device 20. Housing assembly 16 may have a substantially unitary configuration; for example housing 16 may be formed together with the back cover of device 10.

As illustrated in FIG. 3, the various horizontal and vertical orientations of device 10 are arbitrary, and designations of the front, back, top, bottom, and side components may be interchanged without loss of generality. Housing assembly 16 can also be coupled to front glass 12A with a substantially internal frame 18 or bezel member 18A, or via in internal groove in unitary housing 16, for example via an adhesive coupling. One or both of housing 16 and frame or bezel components 18 and 18A can be also formed of a plastic or other durable polymer material, rather than metal, or using a combination of metal, plastic polymer, and composite materials.

Figure 4:
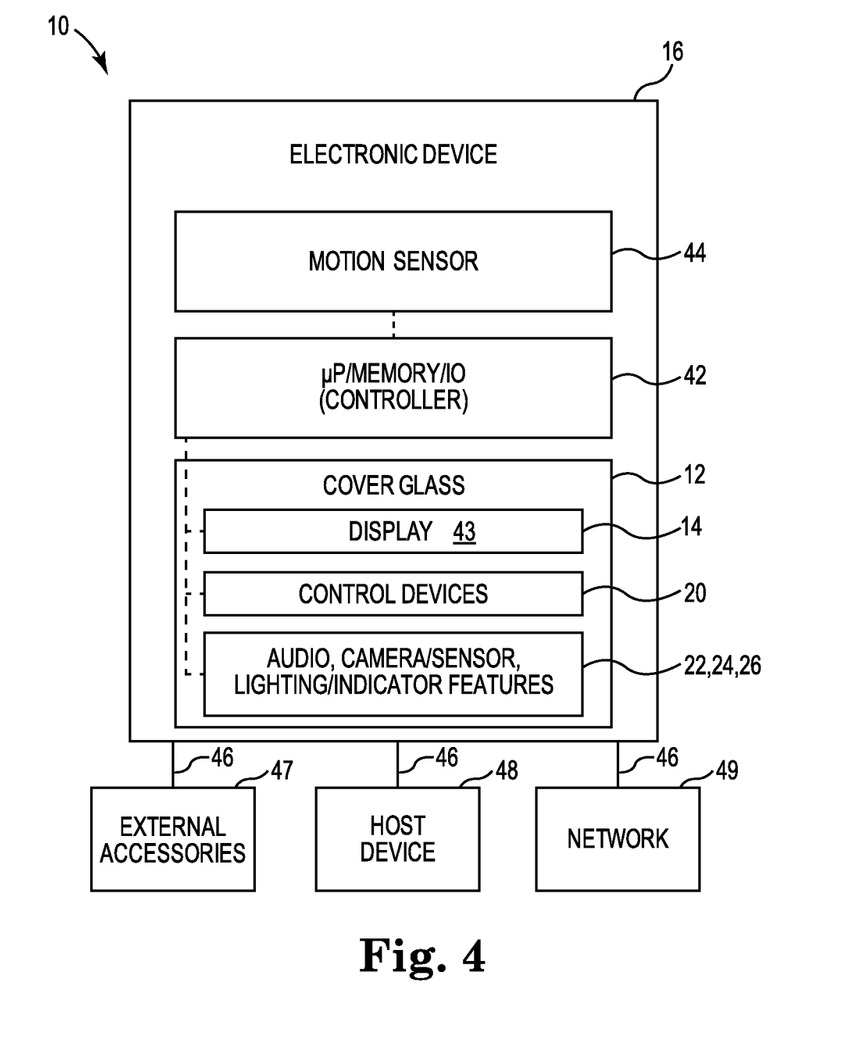
FIG. 4 is a block diagram illustrating internal and external features of the device.

FIG. 4 is a block diagram illustrating various internal and external components of electronic device 10, including microprocessor/controller 42, display 43, an accelerometer or other motion sensor 44, and additional accessories and control features 20, 22, 24, and 26. Device 10 encompasses a range of different portable and stationary electronic applications, as described in FIGS. 1, 2A, 2B, and 3, above, as well as hybrid devices including smartphones with media player capabilities, game players, remote global positioning and telecommunications devices, and laptop, desktop, notebook, handheld and ultraportable computer devices and displays.

As shown in FIG. 4, controller 42 is electronically coupled to display 43, an accelerometer or other motion sensor 44, control devices 20, and accessory features 22, 24, and 26. Various hard-wired and wireless communication connections 46 may be provided to support one or more external accessories 47, host devices 48, and/or networks 49.

Controller 42 includes microprocessor (pp) and memory components configured to execute a combination of operating system and application firmware and software, in order to control device 10 and provide various functionality including, but not limited to, voice communications, voice control, media playback and development, internet browsing, email, messaging, gaming, security, transactions, navigation, and personal assistant functions. Controller 42 may also include a communications interface or other input-output (IO) device configured to support connections 46 to one or more external accessories 47, host devices 48, and network systems 49, including hard-wired, wireless, audio, visual, infrared (IR), and radio frequency (RF) communications.

Display 43 is viewable through front or rear cover glass 12, within display window 14. Cover glass 12 may also accommodate various different control features 20, audio components 22, camera and sensor features 24, and lighting or indicator features 26, including, but not limited to, button and switch control features 20A-20D, speaker and microphone features 22, front and rear camera or sensor features 24A and 24B, and LED flash or lighting/indicator features 26, as described above.

Cover glass 12 comprises one or more of front cover glass 12A, back cover glass 12B, lens cover or inset components 12C and 12D, or other components for electronic device 10, as described above. Cover glass 12 is formed of a substantially single-crystal aluminum oxide, sapphire, or sapphire glass material, and provided with residual compressive stress to improve strength, durability, and stress and strain resistance, as described below.

As used herein, the terms "glass" and "cover glass" are not limited to amorphous forms such as silica glass, but also encompass sapphire, sapphire glass, and other aluminum oxide ceramics, in either substantially single-crystal or polycrystalline form. The terms "sapphire" and "sapphire glass" encompass $\alpha\text{-}Al_2O_3$ and other aluminum oxide materials with varying degrees of trace elements and impurities, including sapphire, corundum, ruby, and ion impregnated or doped aluminum oxide ceramics and sapphire materials.

These definitions reflect usage in the art, in which cover glasses, front glasses, back glasses, glass inlays, glass insets, glass inserts, and other "glass" components may be provided in the form of silica glass, lead crystal, quartz, and other amorphous or polycrystalline forms. The definitions also reflect usage in this disclosure, where cover glasses and other "glass" components may be formed of aluminum oxide ceramics and sapphire materials, in either substantially single-crystal or polycrystalline (e.g., fused polycrystalline) form.

The term "substantially single crystal" encompasses both identically single-crystal and substantially single-crystal forms of sapphire material, as distinguished from amorphous and polycrystalline forms. The term "substantially single crystal" does not does not necessarily imply a fault-free construction, and may include some degree of inclusions and lamellar twinning, including crystal plane orientations in which such localized faults, inclusions, and lamellar twinning are present, but in which the same or substantially similar crystal plane orientation is expressed or extant across the structure the component, or as defined between the first and second (e.g., interior and exterior) major surfaces of the component.

Figure 5A:
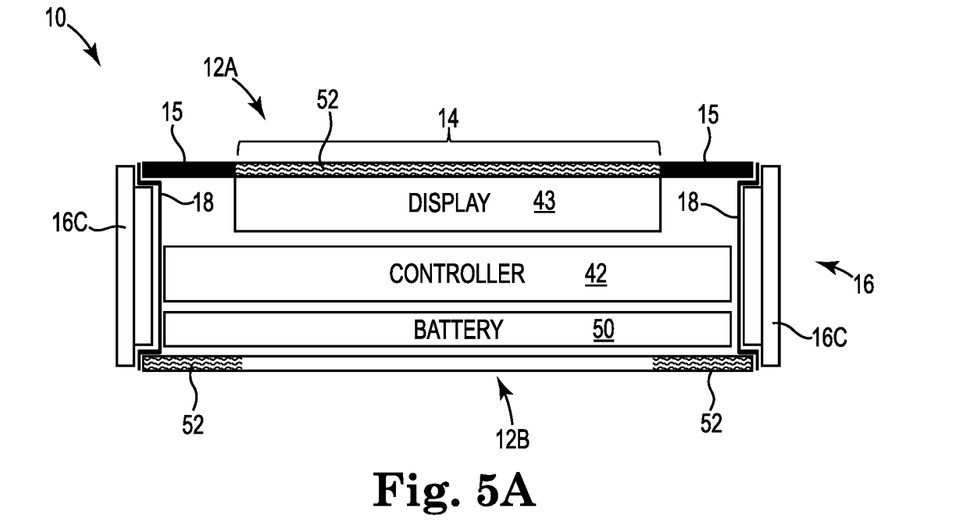
FIG. 5A is a cross-sectional view of the device.

FIG. 5A is a cross-sectional view of electronic device 10, for example as taken along line A-A of FIG. 3, or for any of the other devices 10 as shown in FIGS. 1, 2A, 2B and 4. In this particular configuration, device 10 comprises front glass 12A, back glass 12B, and housing (or housing assembly) 16, with internal components including controller 42, display 43 and a battery or other power source 50.

As shown in FIG. 5A, front glass 12A and back glass 12B are coupled to sides 16C of housing 16, for example via mechanical attachment to frame 18. Controller 42, display 43 and battery 50 are disposed within the interior of device 10, with front glass 12A located in front of (or above) display 10, and back glass 12B located behind (or below) display 43.

Display window 14 is defined as a substantially transparent feature in front glass 12A, in order to observe the viewable area of display 43. Substantially opaque side or border portions 15 may also be provided, in order to define the boundaries of transparent display window 14. Back glass 12B may also include one or more transparent display windows 14, for example to accommodate an additional back-side display or indicator, or a camera or other sensor internal to electronic device 10. Alternatively, one or both of back glass 12A and 12B may be substantially opaque.

One or both of front glass 12A and back glass 12B are formed of an aluminum oxide material to increase durability and improve stress and strain resistance, for example a substantially single-crystal or fused polycrystalline sapphire material, or a layered sapphire material, with thicknesses ranging from about 0.2 mm or less to about 1.0 mm or more. The sapphire material may also be provided with residual compressive stress in selected regions 52, as described below, in order to reduce the risk of damage in the event or a drop or impact event.

Figure 5B:
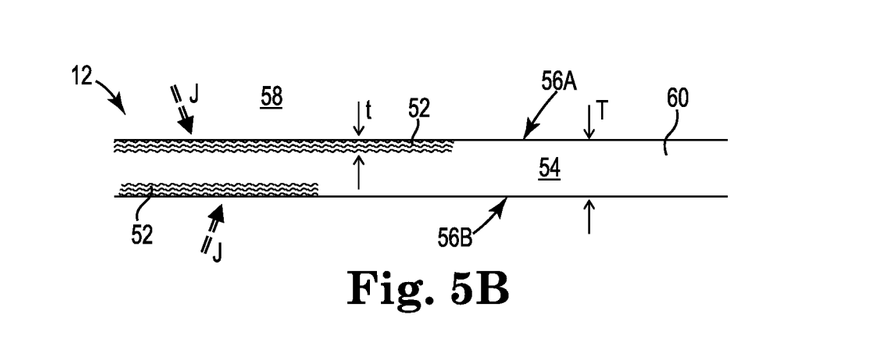
FIG. 5B is a cross-sectional view of a cover glass or other component for the device, illustrating a method for generating residual compressive stress.

FIG. 5B is a schematic diagram illustrating compressive stress in sapphire or ceramic component 12, for example a front or rear cover glass 12A or 12B, as shown in FIG. 5A, or a lens cover 12C, inset 12D, or another sapphire, sapphire glass or ceramic component for electronic device 10, as described above. As shown in FIG. 5B, component 12 is formed of a substantially single crystal or polycrystalline sapphire material in inner region 54, as defined between opposing major surfaces 56A and 56B. One or both of major (e.g., inner and outer) surfaces 56A and 56B may be provided with selected regions 52 of compressive residual stress, in order to improve impact and shock resistance.

Residual compressive stress regions 52 are typically generated after shaping sapphire component 12 into the desired form for use in electronic device 10. Heating, cooling, tempering, quenching, and toughening may be utilized to generate the residual compressive stress, or a combination of such methods. Tempering and toughening, for example, are accomplished by heating sapphire material 54 to an annealing temperature, either in air or using a high temperature vacuum furnace apparatus 58, and then rapidly cooling or quenching one or both surfaces 56A and 56B to produce region(s) 52 of compressive stress.

The annealing temperature for sapphire component 12 is generally above the range of 500 C-700 C used for toughening amorphous silica glass, for example above about 1200 C, or above about 1500 C. The annealing temperature may also be selected in a range below the melting point of sapphire material 54, for example about 1800 C to about 2000 C, as compared to a melting point of about 2030 C to about 2050 C, or in a lower range of about 1900 C to about 1950 C, to an upper range or about 2000 C to about 2020 C.

Cooling may be achieved in a relatively rapid process, for example using jets J of air or other fluid to cool one or both major surfaces 56A and 56B of sapphire component 12, or by quenching. As the selected surfaces of sapphire component 12 are cooled, regions 52 of the sapphire material may contract or deform, relative to interior regions 54, which cool more slowly, and remain closer to the annealing temperature for a longer period of time. As a result, an internal stress distribution is generated within sapphire component 12, producing residual compressive stress in selected surface regions 52. The compressive stress is retained as sapphire component 12 cools to room temperature, and across the typical operational range when assembled into a particular electronic device 10, as shown in FIG. 5A.

Figure 5C:
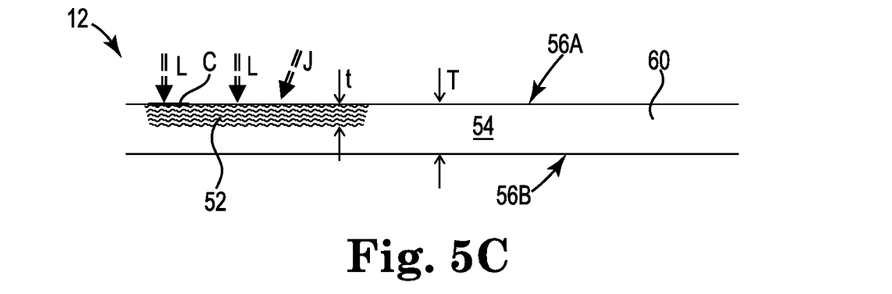
FIG. 5C is a cross-sectional view of the component, illustrating an alternate method for generating residual compressive stress.

FIG. 5C is an alternate cross-sectional view of sapphire component 12, illustrating the formation of residual compressive stress in selected regions 52 by alternate methods, for example via laser heating or laser strengthening. In laser processes, one or more (e.g., infrared or other high power) laser beams L may be utilized to rapidly heat one or both major surfaces 56A and 56B of sapphire component 12. This results in regions 52 of residual compressive stress when the sapphire material cools and contracts. Cooling may be accomplished either by conduction, radiation, and convention, or by application of one or more cooling jets J.

In laser processes, a surface coating (C) (see, FIG. 5C) may be applied to one or both of first and second major surface 56A and 56B, in order to increase surface energy absorption. Surface coating (C) is typically destroyed during the laser heating process, or removed by cleaning. Laser beams L may also be applied either in a continuous beam operation or in a pulsed mode, for example to modulate the power input, or to generate mechanical shock waves in compressive stress regions 52.

Generally, regions 52 of residual compressive stress are stronger and more resistant to breakage and other damage, as compared to other untreated regions 60, which are not subject to the same heating and cooling processes. In particular, compressive stress regions 52 may provide sapphire component 12 with a higher failure loading, for example in excess of 1,000 MPa or more, or about 2,000-3,000 MPa, as determined in a notched beam test or other procedure.

The heating and cooling processes can also be controlled to generate compressive stress regions 52 with relatively greater or less depth, as compared to thickness T of sapphire component 12, between opposing major surfaces 56A and 56B. In the jet-cooled or quenched processes of FIG. 5B, for example, the relative depth and other characteristic of residual compressive stress regions 52 are determined by the thermal properties of cooling jets J, including composition, density, and flow rate. In the laser processes of FIG. 5C, the depth and other characteristics of compressive stress regions 52 are determined by laser frequency, intensity and pulse rate, with or without the application of cooling jets J.

This contrasts with diffusion hardening processes in amorphous glass materials, and ion beam assisted deposition (or ion implantation) methods in sapphire, in which the treatment depth is determined by the transport of ions or diffusive materials through major surfaces 56A or 56B of component 12. In some ion implantation methods, for example, the treatment thickness may be limited to a sub-surface layer no deeper than about 200-300 nm, or less.

These processes also contrast with traditional glass tempering, in which heat is applied to major surfaces 56A and 56B through convection heating, and which are only applicable to parts with significant thickness T, in order to properly create compressive stress layers 52. In the laser heating and jet cooling methods of FIGS. 5B and 5C, however, compressive stress regions or layers 52 may be generated with a broader range of depths or thicknesses t, as appropriate to sapphire component thicknesses T ranging from about 0.3 mm or less up to about 1-2 mm or more.

By controlling the heating time and/or laser profile, sub-surface regions of sapphire component 12 can also be locally or globally heated, and then cooled or quenched to generate compressive stress regions 52 with thicknesses t ranging from about 100-200 nm up to 1 μm or more, while the crystal plane orientation of sapphire component 12 is substantially preserved. One or more laser beams L can also be used to locally or globally generate high temperature on one or both surfaces 56A and 56B of sapphire component 12, before an immediate quench or cooling step using cooing jets or fluid J is applied, generating compressive stress regions 52 with depth or thickness t of up to 0.1 mm or more, or up to 1-10 percent or more of component thickness T.

Compressive stress regions 52 may also exhibit different fracture patterns and other properties, as compared to untreated regions 60, and the heating and cooling processes may be selectively applied to specific regions of sapphire component 12, generating compressive stress regions 52 in areas that are prone to fracture, when assembled into a particular electronic device 10. Sapphire component 12 can also be provided with a customized compressive stress layer 52, for example with varying depth t and surface coverage, in order to provide a defined fracture pattern for extremely high loading conditions, where failure is unavoidable.

Figure 6:
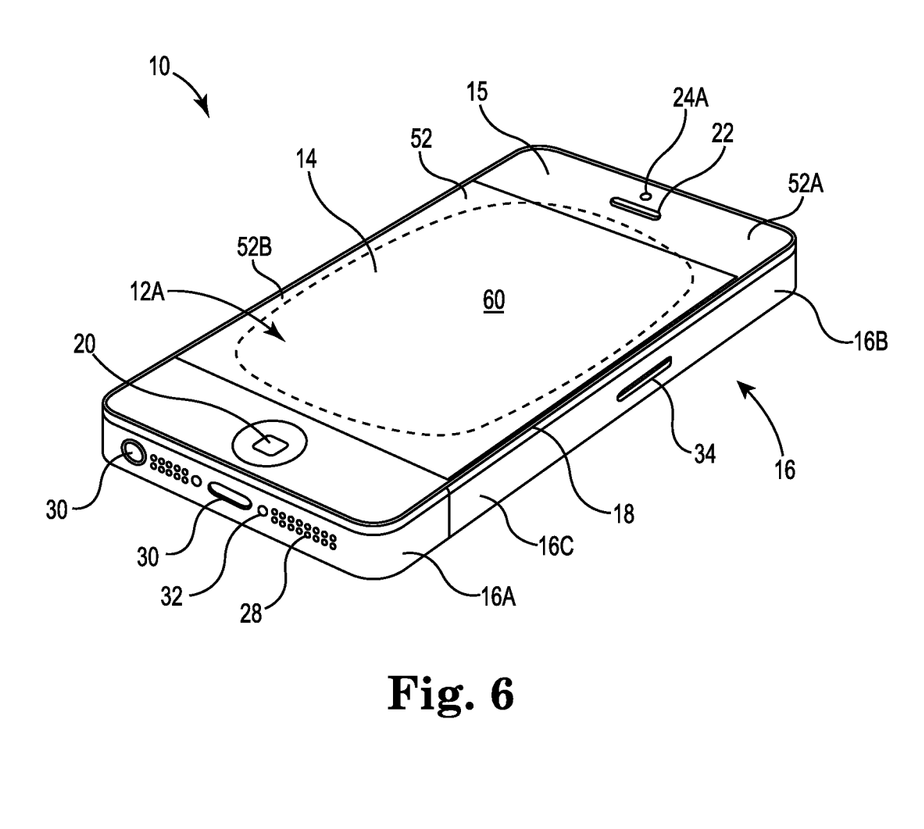
FIG. 6 is perspective view of the electronic device, showing a representative residual compressive stress pattern.

FIG. 6 is perspective view of electronic device 10, showing representative residual compressive stress patterns or regions 52, as defined, e.g., in front cover glass 12A. As shown in FIG. 6, residual compressive stress region 52 (dashed line) may extend substantially about the periphery of cover glass 12A, including corner regions 52A that are prone to mechanical shock or impact when assembled into electronic device 10, as compared to untreated (central or interior) region 60, for example when device 10 is dropped on a hard surface.

Depending upon application, residual compressive stress region 52 may include one or more apertures, for example apertures for a control device 20 or audio device 22, in order to reduce the probability of failure when the aperture is subject to impact, stress or strain. Residual compressive stress region 52 may also include one or more edge regions 52B of cover glass component 12, for example a side or end region 52B extending between corner regions 52A. Alternatively, residual compressive stress region 52 may be defined in one or more corner regions 52A, only, without edge regions 52B, or in any combination of corner regions 52A and side or end regions 52B, and on either or both of the interior and exterior surfaces.

In additional embodiments, the stress pattern may be reversed, with residual compressive stress region 52 provided in a central portion of cover glass 12A, and untreated region 60 disposed in a corner, side, or peripheral portion. Compressive stress region 52 may also extend over substantially the entire surface area of cover glass 12A, on either or both major surfaces, including one or more apertures for control features 20, audio devices 22, and other accessories.

Figure 7:
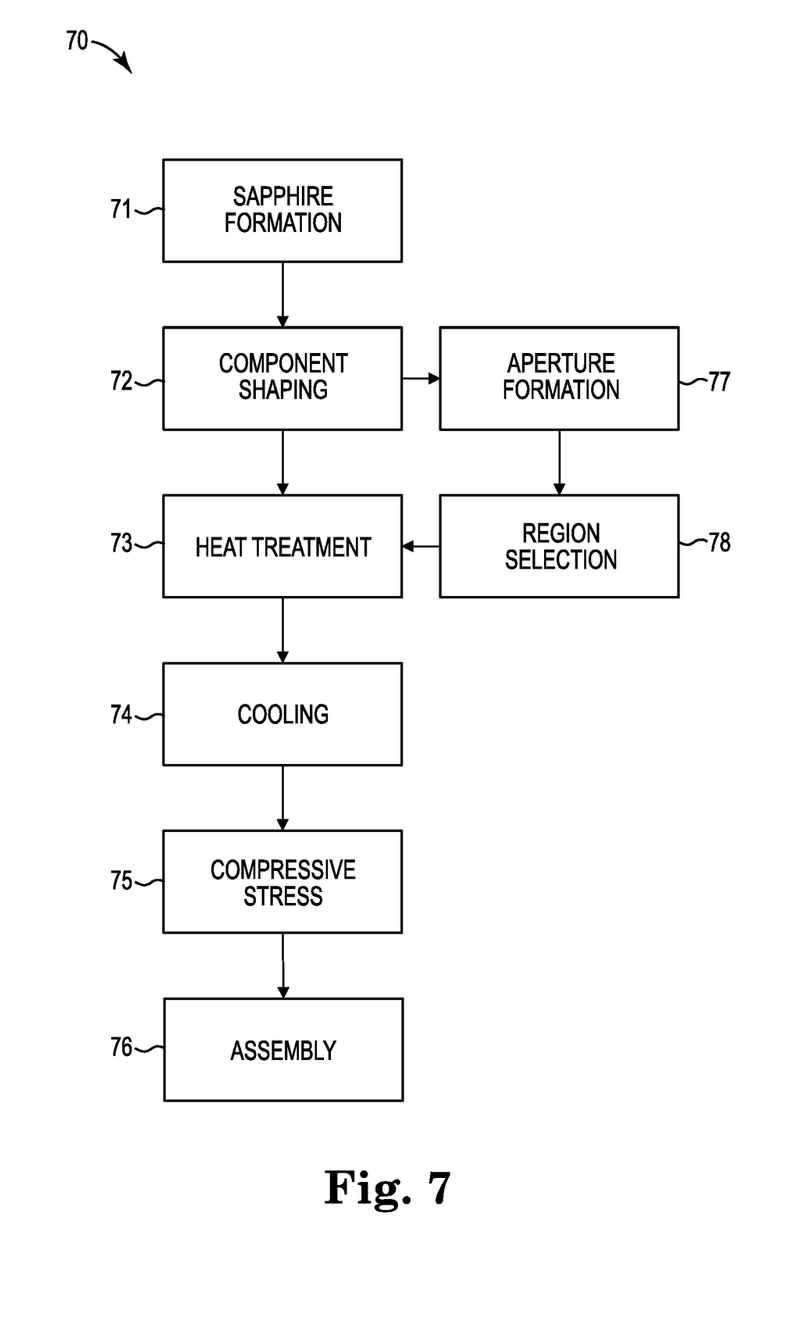
FIG. 7 is block diagram illustrating a method for forming a cover glass component for an electronic device, with residual compressive stress.

FIG. 7 is block diagram illustrating method 70 for forming a cover glass or other sapphire component for an electronic device, with residual compressive stress. As shown in FIG. 7, method 70 comprises one or more of forming a sapphire material (step 71), shaping a sapphire component from the sapphire material (step 72), heating a selected portion of the component (step 73) to an annealing temperature, and cooling the component (step 74) to generate residual compressive stress (step 75). Depending upon application, the component may then be assembled into an electronic device (step 76).

Forming the sapphire material (step 71) may comprise sintering and fusing aluminum oxide (alumina; $Al_2O_3$ or $\alpha$-$Al_2O_3$), for example in an inert atmosphere, in order to produce a substantially single crystal sapphire, ruby or corundum boule. Typical synthesis processes include, but are not limited to, Verneuil processes, Czochralski processes, and flux methods. Alternatively, a polycrystalline or laminated sapphire material may be utilized.

Shaping the component (step 72) comprises cutting, drilling, milling or machining the sapphire material (e.g., using industrial diamond tools) to form the selected component, for example a cover glass, lens cover, inset, or other sapphire component 12A, 12B, 12C, or 12D, as described above. Generally, the sapphire component is defined between first and second major surfaces, for example opposing interior and exterior surfaces, and in some configurations the sapphire material may be laminated.

Depending on application, one or more apertures may also be formed in the component (step 77), in order to accommodate audio devices or other control and accessory features. For example, the component may be provided with one or more apertures to accommodate any of control devices 20 and 20A-20D, microphones or speakers 22, cameras or sensors 24, 24A, and 24B, and lighting or indicator features 26.

Heat treatment (step 73) comprises heating a selected portion of the sapphire component to an annealing temperature. The annealing temperature is typically selected below the melting point of about 2030 C-2050 C, for example about 1800 C-2000 C. Alternatively, a lower temperature annealing or tempering range is utilized, for example above about 1200 C or above about 1500 C.

Heat treatment may be performed using a using a high-temperature furnace or other apparatus, for example in a vacuum environment, or in air. Alternatively, heat treatment (step 73) may be performed with a laser apparatus, for example using a pulsed infrared laser, or another high intensity laser apparatus.

Cooling (step 74) may be performed by quenching or applying air jets or other cooling fluid to the heated surfaces of the sapphire component. Alternatively, cooling may be achieved via any combination of conduction, radiation, and convection, without active quenching or jet cooling.

Cooling generates residual compressive stress (step 75) in the selected (heated and cooled) regions of the sapphire component. Generally, the residual compressive stress may be generated after machining and other forming steps, so that the residual compressive stress is greater in the treated regions of the finished part, as compared to any untreated regions.

Assembly (step 76) comprises assembling the sapphire component into an electronic device, for example a mobile phone, smartphone, computing device, or other mobile or stationary electronic device 10, as described above. The treated regions may be selected (step 78) based on characteristics of the component when assembled into such an electronic device, for example corner or edge regions that are relatively more prone to impact, as compared to any untreated region, such as the central portion of a display or cover glass component.

Alternatively, substantially the entire surface area of the component may be provided with residual compressive stress. The compressive stress pattern(s) may also be provided on either one or both of the major surfaces of the component, with either uniform or varying treatment depth. Based on these parameters, the compressive stress regions may be selected to reduce the risk of damage due to shock or impact or to provide a predefined failure geometry, or to provide both functions.

While this invention has been described with reference to exemplary embodiments, it will be understood by those skilled in the art that various changes may be made and equivalents may be substituted for elements thereof, without departing from the spirit and scope of the invention. In addition, modifications may be made to adapt the teachings of the invention to particular situations and materials, without departing from the essential scope thereof. Thus, the invention is not limited to the particular examples that are disclosed herein, but encompasses all embodiments falling within the scope of the appended claims.

I claim:

1. A method comprising:
shaping a sapphire material into a sapphire component for an electronic device, the sapphire component having first and second major surfaces;
heating a selected region of one or both of the first and second major surfaces of the sapphire component to an annealing temperature that alters a chemical or physical property of the selected region, the annealing temperature being above 700° C. and below 2030° C.; and
quenching the selected region of the sapphire component below the annealing temperature by introducing a fluid to the selected region that cools the selected region at a higher rate as compared to a non-quenched cooling rate, such that residual compressive stress is generated in the selected region of the sapphire component; wherein:
the selected region of the sapphire component having the generated residual compressive stress comprises a depth less than a thickness of the sapphire component; and
the sapphire component further comprises an untreated region positioned adjacent the selected region on the first major surface of the sapphire component.

2. The method of claim 1, further comprising assembling the sapphire component into the electronic device.

3. The method of claim 1, wherein shaping the sapphire material comprises forming the sapphire component with a substantially single crystal plane orientation between the first and second major surfaces.

4. The method of claim 3, wherein the selected region of the sapphire component is prone to impact when assembled into the electronic device.

5. The method of claim 4, wherein the sapphire component forms a cover glass for the electronic device, and the selected region of the sapphire component comprises a corner portion of the cover glass, when the sapphire component is assembled into the electronic device.

6. The method of claim 5, wherein the selected region of the sapphire component excludes a central portion of the cover glass, when the sapphire component is assembled into the electronic device.

7. The method of claim 6, wherein the selected region of the sapphire component comprises at least a portion of each of the first and second major surfaces.

8. The method of claim 1, wherein the selected region of the sapphire component excludes one of the first and second major surfaces.

9. The method of claim 1, further comprising defining a failure pattern in the sapphire component, based on the residual compressive stress generated in the selected region.

10. The method of claim 1, wherein heating the selected region of the sapphire component comprises laser heating one or both of the first and second major surfaces, in the selected region.

11. The method of claim 10, wherein cooling the selected region of the sapphire component comprises directing a jet of cooling fluid onto one or both of the first and second major surfaces, in the selected region.

12. The method of claim 11, wherein a substantially single crystal plane orientation is maintained between the first and second major surfaces of the sapphire component, throughout heating and cooling of the selected region.

13. The method of claim 12, wherein the sapphire component further comprises an inner portion positioned between the first and second major surfaces of the sapphire component, the inner portion comprising the substantially single crystal plane orientation.

14. The method of claim 10 further comprising depositing a surface coating over one or both of the first and second major surfaces of the selected region of the sapphire component prior to the laser heating one or both of the first and second major surfaces of the selected region of the sapphire component.

15. The method of claim 14, wherein the laser heating of one or both of the first and second major surfaces of the selected region further comprises:
removing the deposited surface coating from one or both of the first and second major surfaces of the selected region.

16. The method of claim 1, wherein the depth of the selected region of the sapphire component is within a range of approximately 1% of the thickness of the sapphire component and 10% of the thickness of the sapphire component.

17. The method of claim 1, wherein the quenching of the selected region of the sapphire component comprises cooling the selected region of the sapphire component such that the selected region of the sapphire component maintains a substantially single crystal plane orientation.

18. A method comprising:
shaping a sapphire material into a sapphire component for an electronic device, the sapphire component having first and second major surfaces;
heating the sapphire material to an annealing temperature that is within a range of between 700° C. to 2030° C.; and
forming a residual compressive stress in a selected region of the sapphire component by quenching the selected region of the sapphire component using a fluid that cools the selected region below the annealing temperature at an accelerated cooling rate that is greater than an unquenched cooling rate without the fluid, the selected region of the sapphire component having greater residual compressive stress than an untreated region of the sapphire component in which the residual compressive stress is not induced; wherein:
the selected region of the sapphire component comprises a depth less than a thickness of the sapphire component; and
the untreated region of the sapphire component is positioned below the selected region, within the sapphire component.

19. The method of claim 18, wherein the selected region of the sapphire component comprises an aperture for an audio device.

20. The method of claim 18, wherein the sapphire component is positioned adjacent a display of the electronic device.

21. The method of claim 20, wherein the first major surface of the sapphire component is positioned adjacent the display and oriented toward an interior of the electronic device.

22. The method of claim 20, wherein the second major surface of the sapphire component is positioned opposite the display and oriented toward an exterior of the device.

23. The method of claim 20, wherein the display is visible through the sapphire component.

24. A method comprising:
heating a selected region of at least one surface of a sapphire component for an electronic device to an annealing temperature that is less than 2030° C. and greater than 700° C., the selected region exhibiting a material toughness distinct from an untreated region of the sapphire component based on the annealing temperature altering a chemical or physical property of the selected region;
quenching the selected region of the sapphire component below the annealing temperature such that a differential cooling rate is generated between the selected region and the untreated region of the sapphire component that is not subject to the quenching; and
creating a residual compressive stress in the selected region of the sapphire component, the generated residual compressive stress created in the selected region of the sapphire component comprises a depth less than a thickness of the sapphire component; wherein
the selected region of the sapphire component is substantially surrounded by the untreated region of the sapphire component.

25. The method of claim 24, wherein the untreated region of the sapphire component comprises a compressive stress less than the residual compressive stress created in the selected region of the sapphire component.

26. The method of claim 24, wherein the untreated region is formed on:
the at least one surface of the sapphire component comprising the selected region; and
on at least one distinct surface, distinct from the at least one surface of the sapphire component comprising the selected region.

27. The method of claim 24, wherein the creating of the residual compressive stress in the selected region of the sapphire component further comprises creating the residual compressive stress in the selected region comprising at least a portion of a second surface of the sapphire component, the second surface distinct from the first surface.

\* \* \* \* \*